US008608493B2

(12) United States Patent
Cowles et al.

(10) Patent No.: US 8,608,493 B2
(45) Date of Patent: Dec. 17, 2013

(54) KEYING MECHANISM FOR DEVICE BAY

(75) Inventors: David R Cowles, Granite Bay, CA (US);
Robert Dobbs, Granite Bay, CA (US);
James D Hensley, Rocklin, CA (US);
John Machado, Folsom, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 29 days.

(21) Appl. No.: 13/456,147

(22) Filed: Apr. 25, 2012

(65) Prior Publication Data
US 2013/0288494 A1 Oct. 31, 2013

(51) Int. Cl.
*H01R 13/44* (2006.01)
(52) U.S. Cl.
USPC .......................................... 439/138; 439/680
(58) Field of Classification Search
USPC ..................... 439/136–140, 633, 680, 681
See application file for complete search history.

(56) References Cited

U.S. PATENT DOCUMENTS

| | | | | | |
|---|---|---|---|---|---|
| 3,614,714 | A | * | 10/1971 | Silverstein | 439/633 |
| 3,634,816 | A | * | 1/1972 | Zell | 439/633 |
| 3,818,280 | A | * | 6/1974 | Smith et al. | 439/633 |
| 4,053,724 | A | * | 10/1977 | Llona | 200/51 R |
| 4,546,414 | A | * | 10/1985 | Donges | 361/786 |
| 4,598,336 | A | * | 7/1986 | Hehl | 361/725 |
| 4,800,462 | A | * | 1/1989 | Zacher et al. | 361/786 |
| 4,820,169 | A | * | 4/1989 | Weber et al. | 439/65 |
| 5,019,947 | A | * | 5/1991 | Pelzl | 361/802 |
| 5,733,149 | A | * | 3/1998 | Groves et al. | 439/680 |
| 5,751,558 | A | * | 5/1998 | Gullicksrud et al. | 361/801 |
| 5,805,903 | A | * | 9/1998 | Elkhoury | 713/300 |
| 5,911,050 | A | * | 6/1999 | Egan et al. | 710/100 |
| 6,017,248 | A | * | 1/2000 | Pan et al. | 439/681 |
| 6,501,659 | B1 | * | 12/2002 | Bodensteiner et al. | 361/732 |
| 6,869,319 | B2 | * | 3/2005 | Yamada et al. | 439/681 |
| 6,921,296 | B2 | * | 7/2005 | Lecinski et al. | 439/680 |
| 6,927,983 | B1 | * | 8/2005 | Beseth et al. | 361/796 |
| 7,210,586 | B2 | * | 5/2007 | Ice | 211/26 |
| 7,227,756 | B2 | * | 6/2007 | Gagnon et al. | 361/732 |
| 7,272,012 | B2 | * | 9/2007 | Salinas et al. | 361/727 |
| 7,442,088 | B2 | * | 10/2008 | Looney et al. | 439/633 |
| 7,542,296 | B1 | * | 6/2009 | Baik et al. | 361/730 |
| 7,611,387 | B1 | | 11/2009 | Zhang | |
| 7,780,481 | B2 | | 8/2010 | Chen et al. | |
| 7,841,878 | B2 | | 11/2010 | Johnson et al. | |
| 7,896,683 | B1 | * | 3/2011 | Ratzlaff et al. | 439/374 |
| 7,903,393 | B2 | * | 3/2011 | Buxton et al. | 361/608 |
| 8,149,586 | B2 | * | 4/2012 | Curnalia et al. | 361/786 |
| 8,177,586 | B2 | * | 5/2012 | Daschner et al. | 439/680 |
| 2002/0111078 | A1 | * | 8/2002 | Sevier et al. | 439/680 |
| 2002/0176231 | A1 | * | 11/2002 | Bodensteiner et al. | 361/724 |
| 2003/0017748 | A1 | * | 1/2003 | Morita et al. | 439/680 |
| 2004/0092172 | A1 | * | 5/2004 | Munger et al. | 439/680 |
| 2005/0164562 | A1 | * | 7/2005 | Lee et al. | 439/680 |
| 2006/0073719 | A1 | | 4/2006 | Kiani | |
| 2006/0199437 | A1 | * | 9/2006 | Allison | 439/680 |
| 2006/0240715 | A1 | * | 10/2006 | Zueck et al. | 439/681 |
| 2010/0190384 | A1 | * | 7/2010 | Lanni | 439/680 |
| 2010/0273361 | A1 | * | 10/2010 | Lord | 439/680 |
| 2011/0003516 | A1 | * | 1/2011 | Daschner et al. | 439/680 |
| 2011/0294361 | A1 | * | 12/2011 | Schrader | 439/680 |
| 2013/0102202 | A1 | * | 4/2013 | Aita | 439/680 |

* cited by examiner

Primary Examiner — Ross Gushi

(57) ABSTRACT

A keying mechanism within a device bay allows a device connector of a device to make electrical connection with the device bay connector when a key slot of the device is located in one of a plurality of predetermined locations on the device. The keying mechanism prevents the device connector from making electrical connection with the device bay connector when the device does not have a key slot in any of the predetermined locations.

15 Claims, 8 Drawing Sheets

KEYING MECHANISM FOR DEVICE BAY

BACKGROUND

Devices such as power supplies are often implemented as modules that can be placed in a device bay. When the module is seated in the device bay, one or more electrical connectors of the module are physically in contact with one or more connectors at the back of the device bay. When a connector on the module does not match a connector in the back of the device bay, this may result in the module being physically prevented from being seated in the device bay.

Sometimes modules may have identical or near identical physical form but different electrical characteristics. For example, two power supplies may have a same form factor and same connectors, but have different electrical characteristics. For example, the two power supplies may supply current at a different voltage and/or a different power level. For some applications, it may be acceptable to use either of the two power supplies despite the difference in electrical characteristics. In other applications one power supply may be acceptable while the other may not.

DETAILED DESCRIPTION

A keying mechanism in a device bay assures that devices placed in the device bay must have a key slot located in one of a plurality of predetermined locations in order for the device to be seated into the device bay. What is meant by seated is that the module is placed deeply enough into the device bay so that a connector of the device is allowed to make electrical contact with a connector mounted in the device bay. When a device does not have a key slot located in a correct location, the keys prevent the device from being seated into the device bay.

Figure 1:
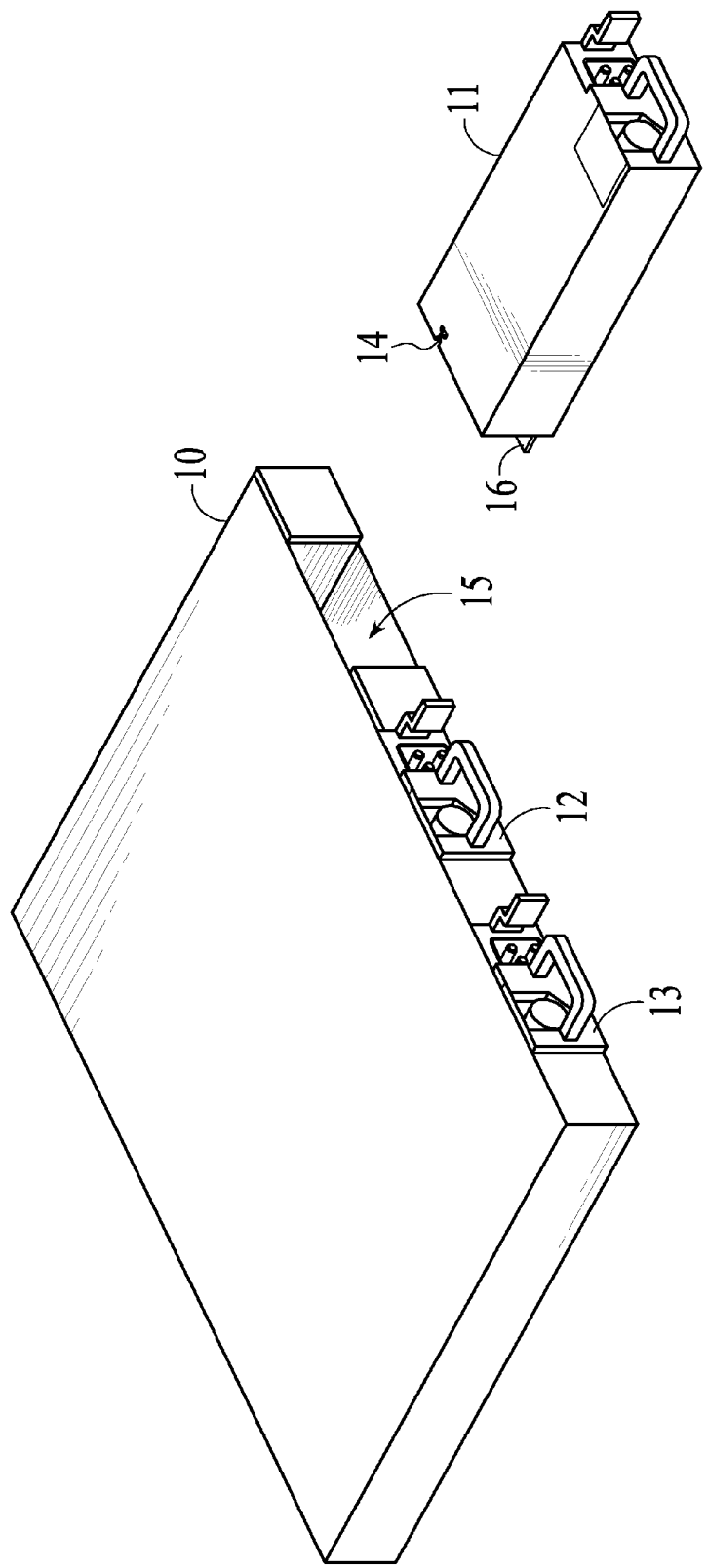
FIG. 1 is a simplified diagram showing a device ready to be placed in a device bay, in accordance with an implementation.

FIG. 1 shows a device bay 15 within device housing 10. For example, a device 11 is shown ready to be placed within bay 15. A device 12 and a device 13 are shown already seated in device bays within device housing 10. Device 11 includes a key slot 14 and a connector consisting of a printed circuit board 16 and connector contacts located on printed circuit board 16. For example each of device 11, device 12 and device 13 is a power supply module and housing 10 is housing for a power shelf used in a network server rack or other type of equipment rack for equipment such as computers or networking devices.

Figure 2:
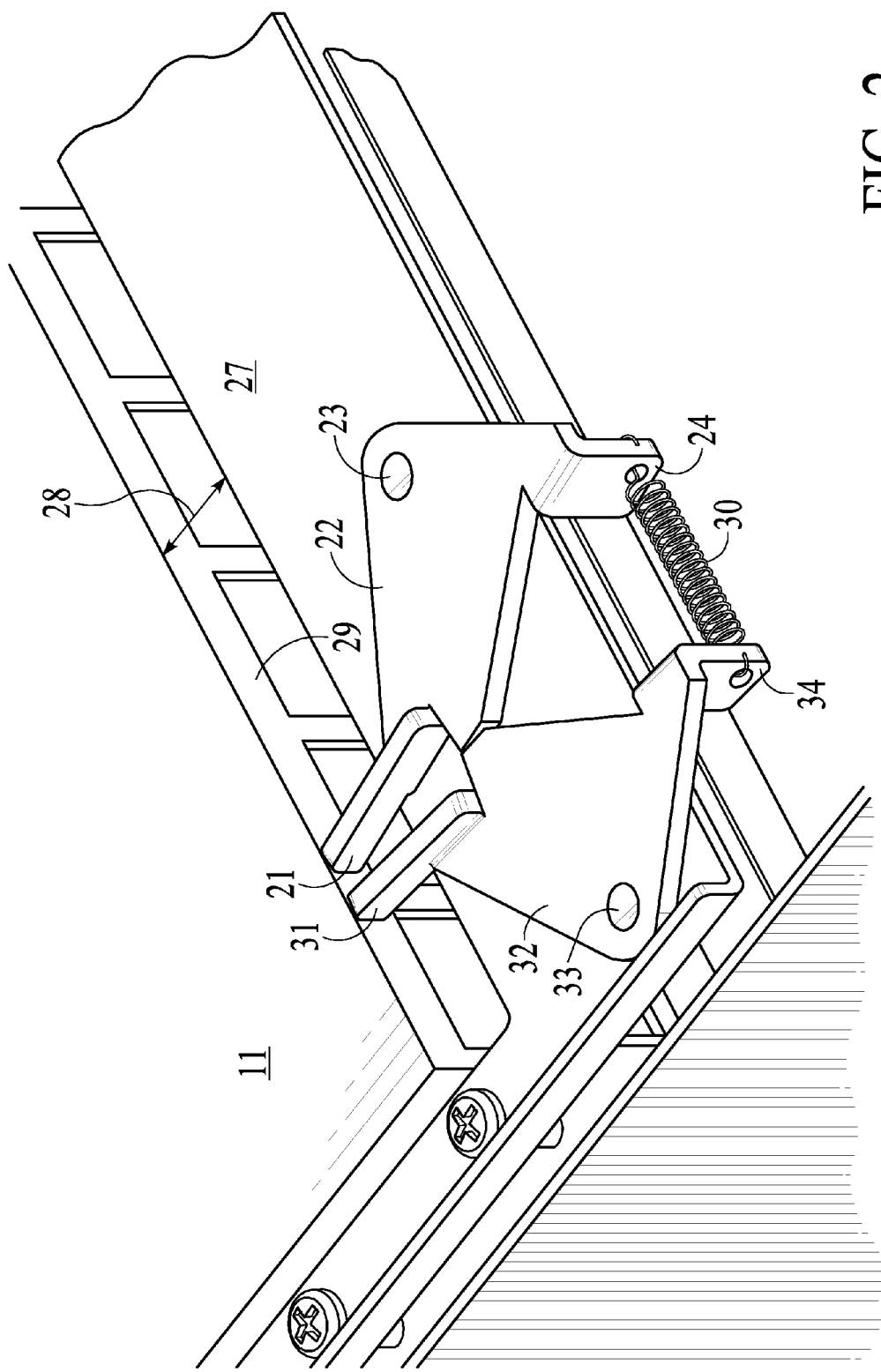
FIG. 2 is simplified diagram showing keys preventing a device from being seated in a device bay, in accordance with an implementation.

FIG. 2 shows an inside portion of device bay 15 and shows device 11 having been placed in device bay 15. Key slot 14 of device 11, shown in FIG. 1, is on a right side of device 11. Only the left side of device 11 is shown in FIG. 2, so key slot 14 does not appear in FIG. 2. A key 21 and a key 31 keep a back edge 29 of device 11 a distance 28 away from a base plate 27 of device bay 15. This prevents the connector contacts on printed circuit board 16 from coming in contact with matching connector contacts on a connector mounted within device bay 15.

Key 21 is connected to a plate 22 which rotates at a pivot connection 23 to base plate 27. Likewise, key 31 is connected to a plate 32 which rotates at a pivot connection 33 to base plate 27. A brace 34 is connected to plate 32. A brace 24 is connected to plate 22. A spring 30 connected between a brace 24 and brace 34 maintains key 21 and key 31 in a neutral position when no device is within device bay 15.

Figure 3:
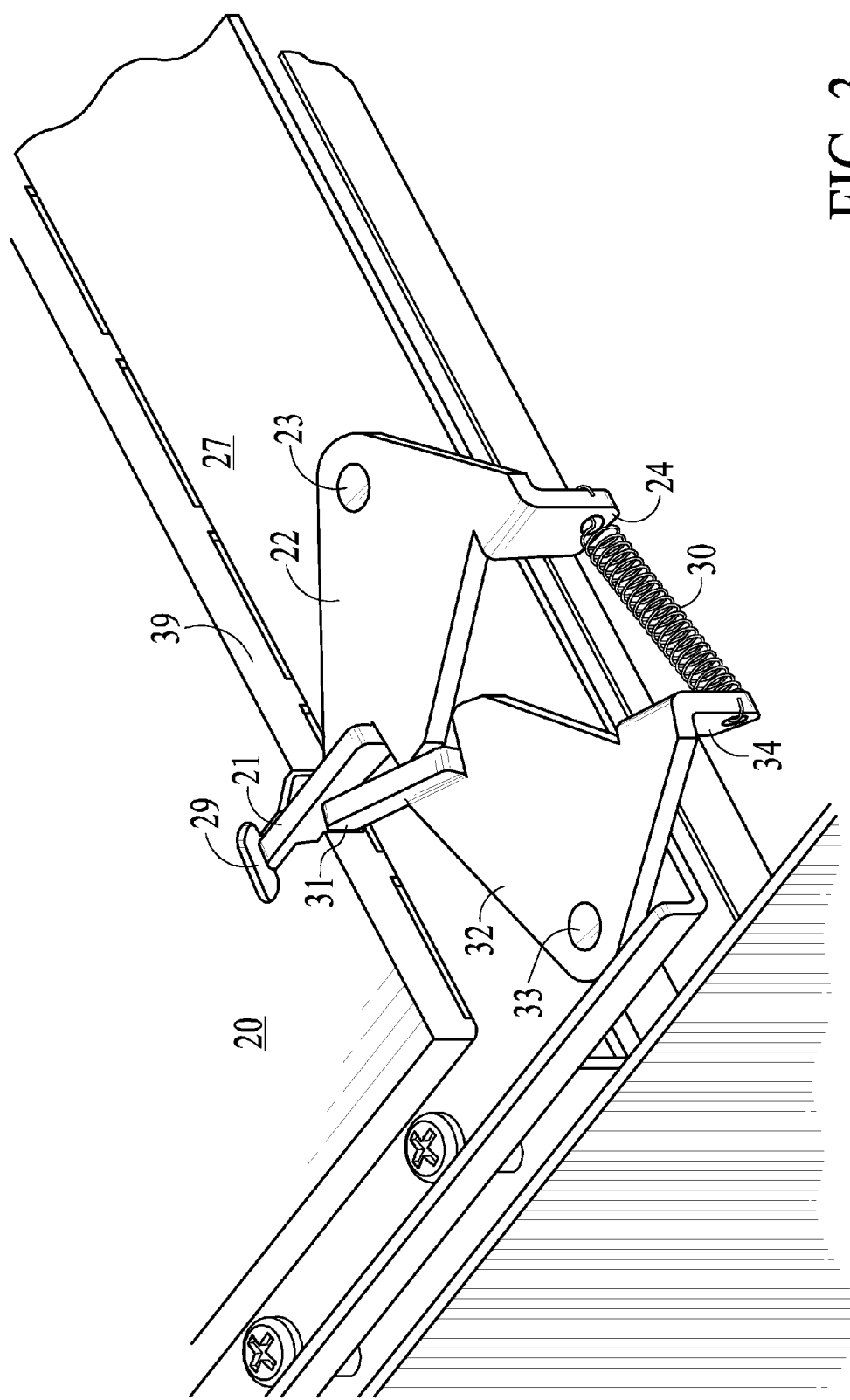
FIG. 3 is a simplified diagram showing a key situated in a key slot of a device allowing the device to be seated in a device bay, in accordance with an implementation.

FIG. 3 shows a device 20 with a key slot 29 having been seated within device bay 15. The location of key slot 29 is such that as device 20 is pushed into device bay 15, key 21 slides into key slot 29. This allows back edge 39 to be flush with base plate 27 of device bay 15. The result is that connector contacts on a printed circuit board of device 20 come in contact with matching connector contacts of a connector mounted within device bay 15.

As shown in FIG. 3, plate 22 is rotated slightly around pivot point 23 as key 21 slid into key slot 29. Plate 32 also rotated around pivot 33 positioning key 31 so that key 31 did not prevent device 20 from being seated within device bay 15. Spring 30 is expanded to accommodate the amount of rotation of plate 22 around pivot 23 and to accommodate the amount of rotation of place 32 around pivot 33. When device 20 is removed from device bay 15, tension in spring 30 will cause plate 32 and plate 22 to rotate back to their neutral position.

Figure 4:
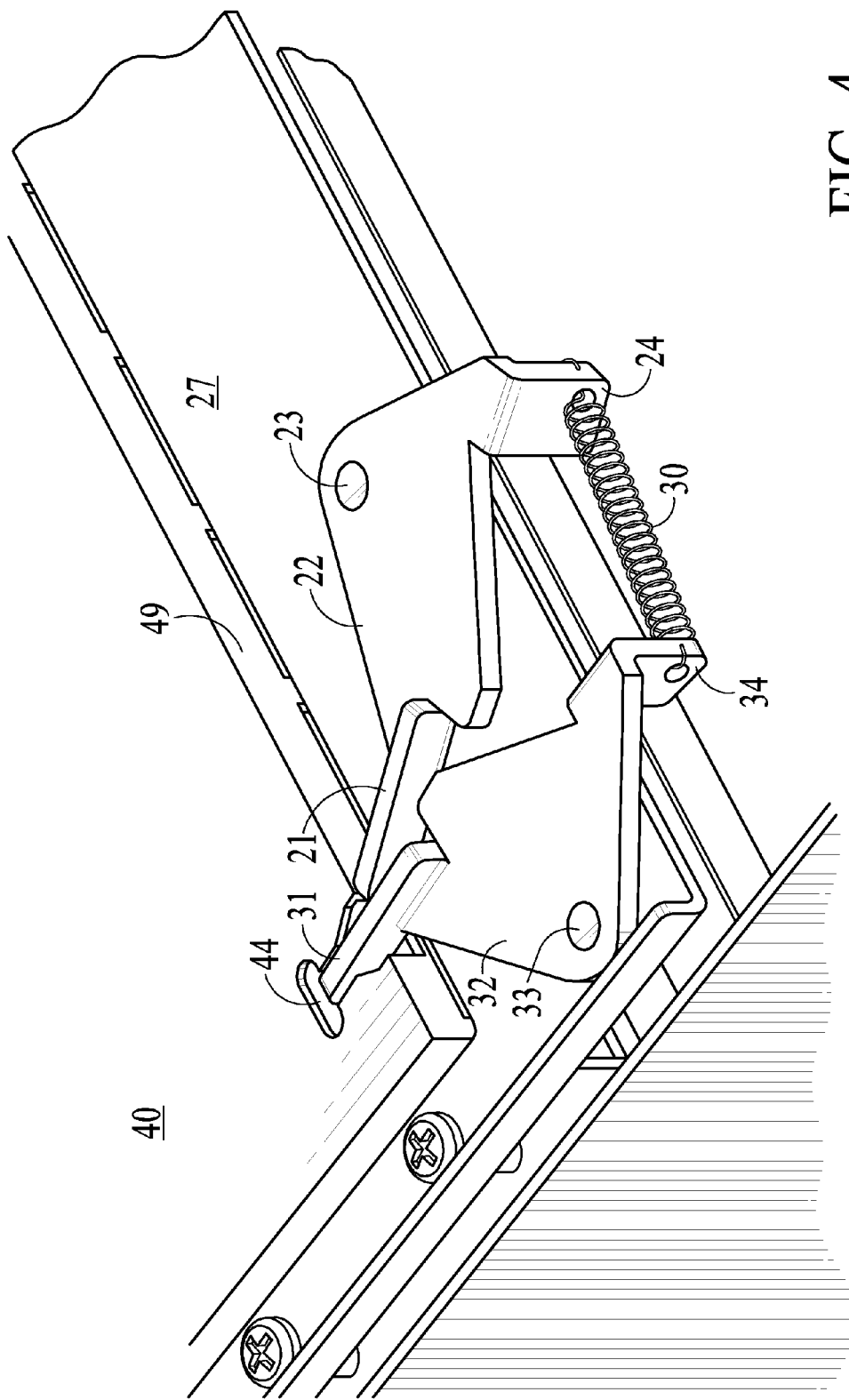
FIG. 4 is another simplified diagram showing a key situated in a key slot of a device allowing the device to be seated in a device bay, in accordance with an implementation.

FIG. 4 shows a device 40 with a key slot 44 having been seated within device bay 15. The location of key slot 44 is such that as device 40 is pushed into device bay 15, key 31 slides into key slot 44. This allows back edge 44 to be flush with base plate 27 of device bay 15. The result is that connector contacts on a printed circuit board of device 40 come in contact with matching connector contacts of a connector mounted within device bay 15.

As shown in FIG. 4, plate 32 is rotated slightly around pivot point 33 as key 31 slid into key slot 44. Plate 22 also rotated around pivot 23 positioning key 21 so that key 21 did not prevent device 40 from being seated within device bay 15. Spring 30 is expanded to accommodate the amount of rotation of plate 22 around pivot 23 and to accommodate the amount of rotation of place 32 around pivot 33. When device 40 is removed from device bay 15, tension in spring 30 will cause plate 32 and plate 22 to rotate back to their neutral position.

Figure 5:
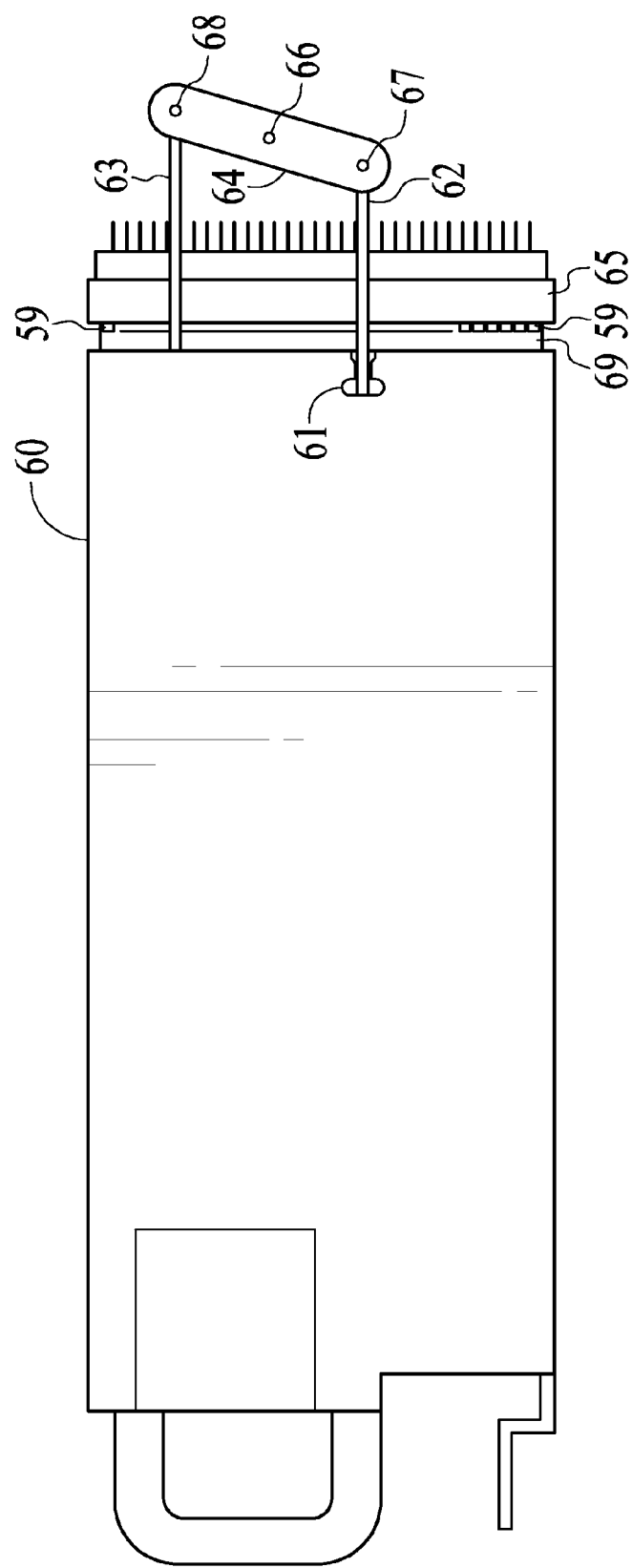
FIG. 5 is a simplified diagram showing a key situated in a key slot of a device allowing the device to be seated in a device bay, in accordance with an implementation.

FIG. 5 is a simplified inside top view of a device bay in which is seated a device 60. The location of a key slot 61 is such that as device 60 is pushed into the device bay, a key 62 slides into key slot 61. This allows connector contacts 59 of a printed circuit board 69 of device 60 to be inserted within a connector 65 of the device bay establishing electrical contact between contacts 59 on printed circuit board 69 and connector 65 of the device bay.

As shown in FIG. 5, a rod 64 is rotated around a pivot 66 in such a way that key 63, connected to rod 64 at a pivot connection 68, is rotated back from device 60 as key 62, connected to rod 64 at a pivot connection 67, slides into key slot 61.

Figure 6:
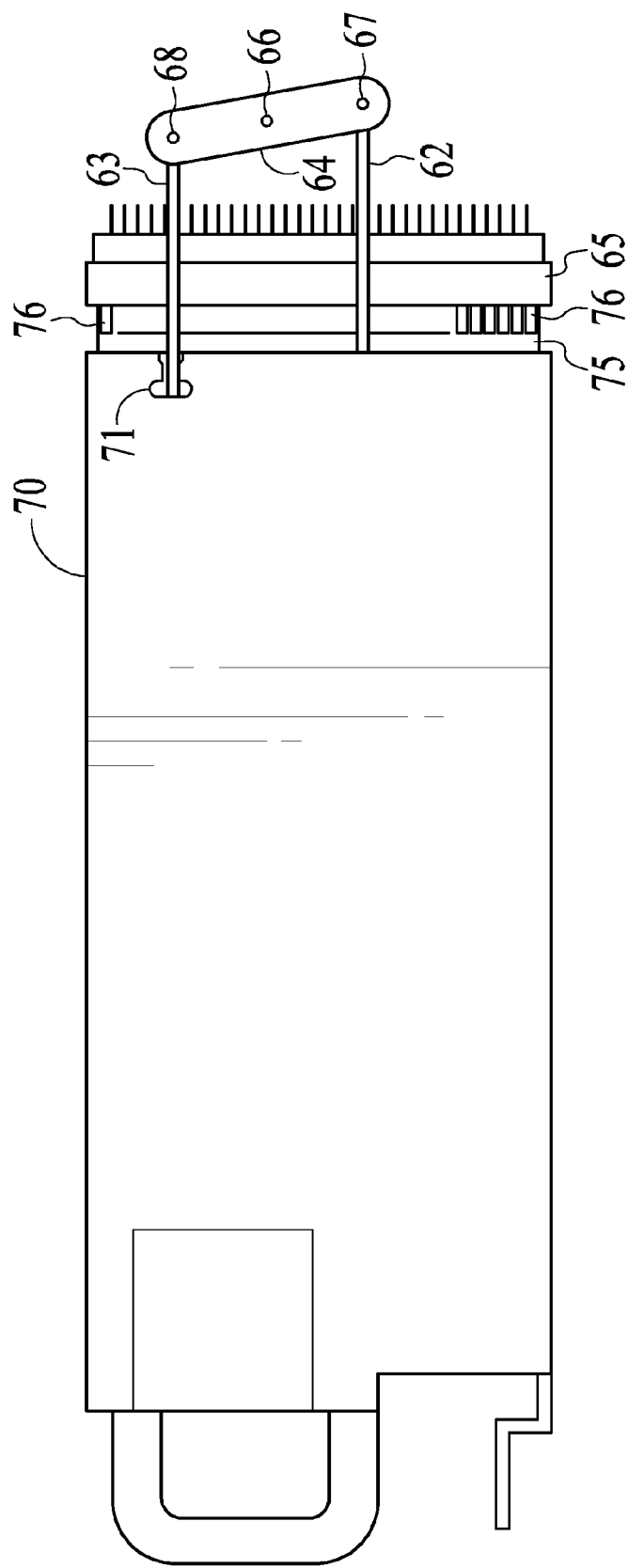
FIG. 6 is another simplified diagram showing a key situated in a key slot of a device allowing the device to be seated in a device bay, in accordance with an implementation.

FIG. 6 is a simplified inside top view of the device bay in which is seated a device 70. The location of a key slot 71 is such that as device 70 is pushed into the device bay, key 63 slides into key slot 71. This allows connector contacts 76 of a printed circuit board 75 of device 70 to be inserted within connector 65 of the device bay establishing electrical contact between contacts 76 of printed circuit board 75 and connector 65 of the device bay.

As shown in FIG. 6, rod 64 is rotated around pivot 66 in such a way that key 62 is rotated back from device 60 as key 63 slides into key slot 71.

Figure 7:
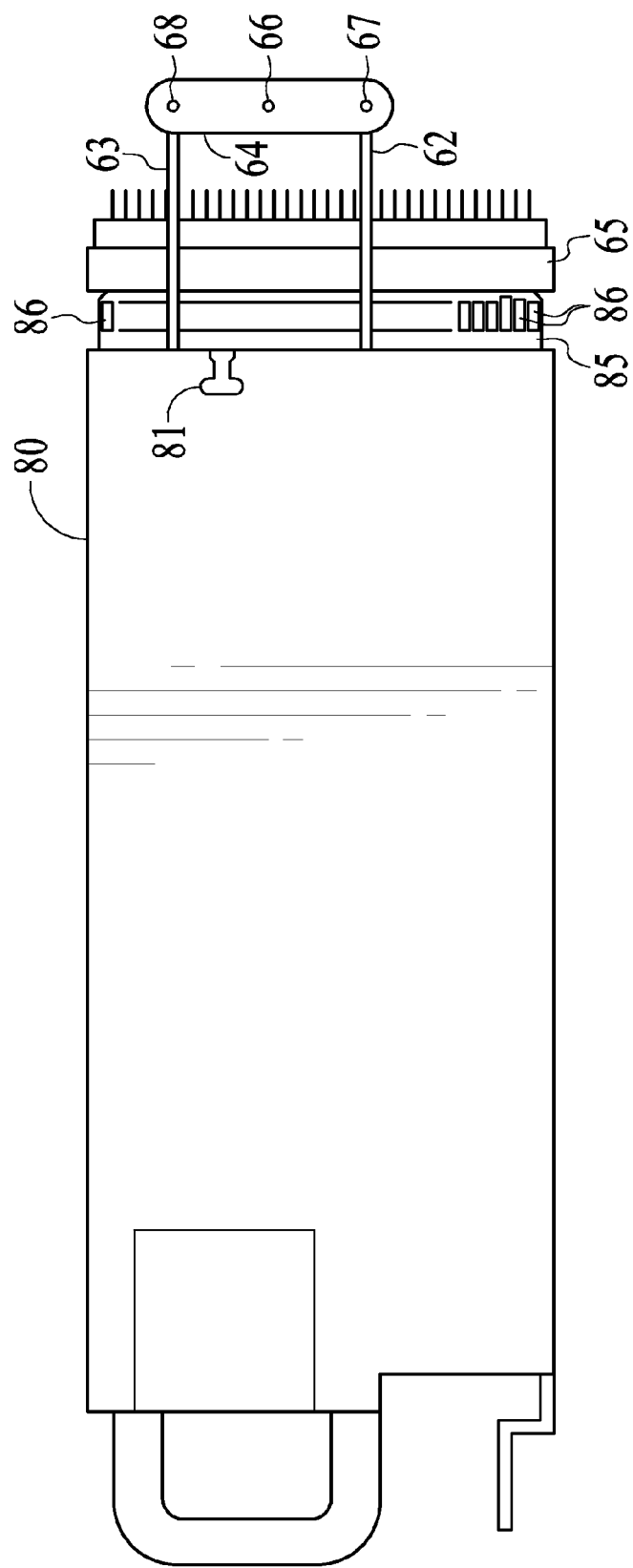
FIG. 7 is simplified diagram showing keys preventing a device from being seated in a device bay, in accordance with an implementation.

FIG. 7 is a simplified inside top view of the device bay in which is located a device 80. The location of a key slot 81 is such that as device 80 is pushed into the device bay, neither key 62 nor key 63 will slide into key slot 81. This prevents connector contacts 86 of a printed circuit board 85 of device 80 from being inserted within connector 65 of the device bay. No electrical contact is established between contacts 86 of printed circuit board 85 and connector 65 of the device bay.

As shown in FIG. 7, rod 64 is rotated around a pivot connector 66 in such a way that key 62 and key 63 both prevent device 80 from being seated within the device bay.

Figure 8:
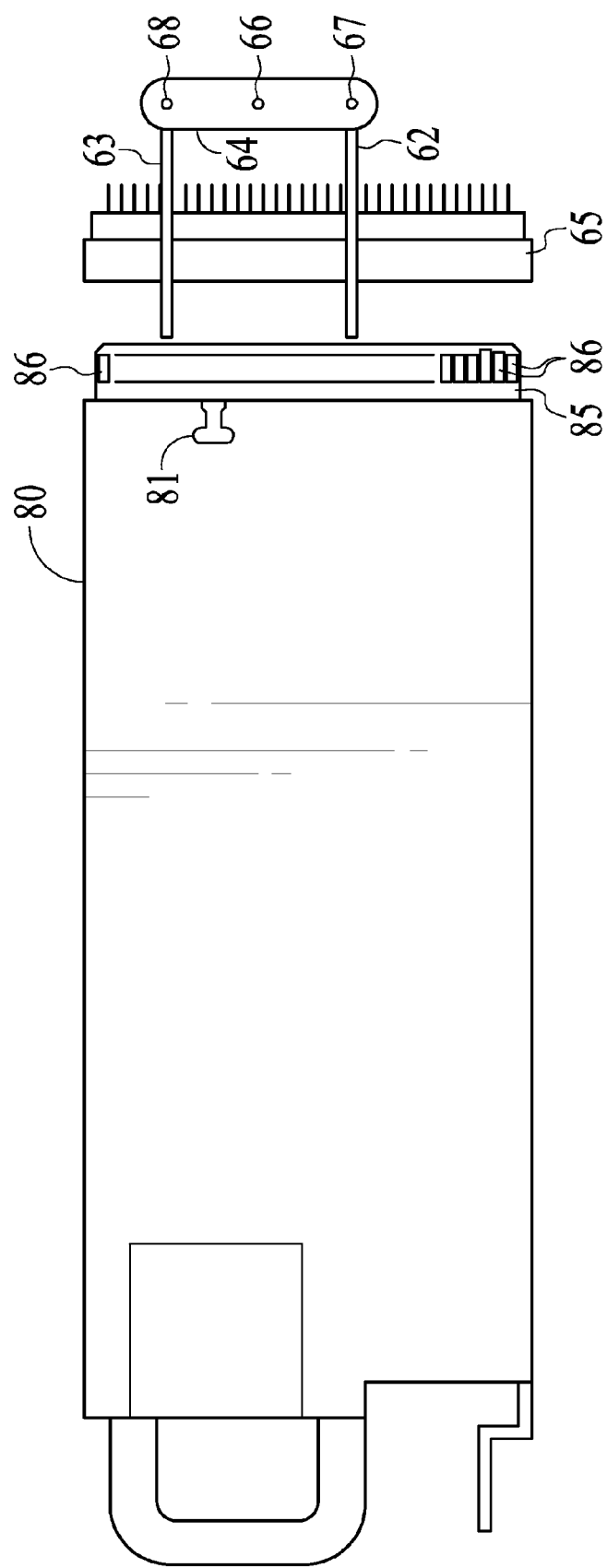
FIG. 8 is simplified diagram showing keys in a neutral position before preventing a device from being seated in a device bay, in accordance with an implementation

FIG. 8 shows rod 64 in a neutral position before contact is made between device 80 and keys 62 and 63.

The disclosed subject matter may be implemented in other specific forms without departing from the spirit or characteristics thereof. Accordingly, the present disclosure is intended to be illustrative, but not limiting, of the scope of the following claims.

We claim:

1. A keying mechanism for a device bay comprising:
    a first key that fits into a key slot located in a first position on a first device when the first device is seated within the device bay;
    a second key that fits into a key slot located in a second position on a second device when the second device is seated within the device bay;
    wherein the first key and the second key are mounted so that the first key and the second key prevent a third device from being seated within the device bay, when the third device does not have a key slot located in the first position on the third device and also does not have a key slot located in the second position on the third device; and,
    wherein the first key and the second key are mounted so that the first device can be seated within the device bay even when the first device does not have a key slot located in the second position and so that the second device can be seated within the device by even when the second device does not have a key slot located in the first position.

2. A keying mechanism as in claim 1 wherein the first device, the second device and the third device are each a power supply module.

3. Device housing comprising:
    a device bay including
        a device bay connector:
        a first key that allows a device connector of a device to make electrical connection with the device bay connector when a key slot of the device is located in a first position on the device and there is no key slot in a second position of the device; and,
        a second key that allows the device connector to make electrical connection with the device bay connector when the key slot of the device is located in the second position the device and there is no key slot in the first position of the device;
    wherein the first key and the second key prevent the device connector from making electrical connection with the device bay connector when the key slot of the device is not located in either of the first position or the second position.

4. Device housing as in claim 3, additionally comprising: an additional device bay.

5. Device housing as in claim 3, wherein the device is a power supply module.

6. A method performed automatically by a keying mechanism within a device bay, the method comprising:
    allowing a device connector of a device to make electrical connection with the device bay connector when a key slot of the device is located in any one of a plurality of predetermined locations on the device;
    preventing the device connector from making electrical connection with the device bay connector when the device does not have a key slot in any of the predetermined locations.

7. A method as in claim 6 additionally comprising:
    sliding a first key into a key slot of the device when the key slot is located in a first predetermined location on the device; and,
    sliding a second key into the key slot of the device when the key slot is located in a second predetermined location on the device.

8. A method as in claim 6 additionally comprising:
    sliding a first key into a key slot of the device when the key slot is located in a first predetermined location on the device;
    sliding a second key into the key slot of the device when the key slot is located in a second predetermined location on the device;
    utilizing the first key and the second key to block the device from being seated in the device bay when the key slot of the device is not located in either of the first location or the second location.

9. A keying mechanism for a device bay comprising:
    a first key that fits into a key slot located in a first position on a first device when the first device is seated within the device bay;
    a second key that fits into a key slot located in a second position on a second device when the second device is seated within the device bay;
    wherein the first key and the second key are mounted so that the first key and the second key prevent a third device from being seated within the device bay, when the third device does not have a key slot located in the first position on the third device and also does not have a key slot located in the second position on the third device;
    wherein the first key is connected to a first plate that is fastened at a pivot connection to a base plate of the device bay; and,
    wherein the second key is connected to a second plate that is fastened at a pivot connection to base plate.

10. A keying mechanism as in claim 9:
    wherein a spring holds the first key and the second key in a neutral position when there is no device within the device bay.

11. A keying mechanism for a device bay comprising:
    a first key that fits into a key slot located in a first position on a first device when the first device is seated within the device bay;

a second key that fits into a key slot located in a second position on a second device when the second device is seated within the device bay;

wherein the first key and the second key are mounted so that the first key and the second key prevent a third device from being seated within the device bay, when the third device does not have a key slot located in the first position on the third device and also does not have a key slot located in the second position on the third device;

wherein the first key is connected to a pivot connection of a rod of the device bay; and, wherein the second key is connected to a pivot connection of the rod.

12. A keying mechanism as in claim 11:

wherein the rod rotates around a pivot connector.

13. Device housing comprising:

a device bay including
    a device bay connector:
        a first key that allows a device connector of a device to make electrical connection with the device bay connector when a key slot of the device is located in a first location on the device; and,
        a second key that allows the device connector to make electrical connection with the device bay connector when the key slot of the device is located in a second location on the device;

wherein the first key and the second key prevent the device connector from making electrical connection with the device bay connector when the key slot of the device is not located in either of the first location or the second location;

wherein the first key is connected to a first plate that is fastened at a pivot connection to a base plate of the device bay; and, wherein the second key is connected to a second plate that is fastened at a pivot connection to base plate.

14. Device housing comprising:

a device bay including
    a device bay connector:
        a first key that allows a device connector of a device to make electrical connection with the device bay connector when a key slot of the device is located in a first location on the device; and,
        a second key that allows the device connector to make electrical connection with the device bay connector when the key slot of the device is located in a second location on the device;

wherein the first key and the second key prevent the device connector from making electrical connection with the device bay connector when the key slot of the device is not located in either of the first location or the second location; and, wherein the device bay additionally includes a spring that holds the first key and the second key in a neutral position when there is no device within the device bay.

15. Device housing comprising:

a device bay including
    a device bay connector:
        a first key that allows a device connector of a device to make electrical connection with the device bay connector when a key slot of the device is located in a first location on the device; and,
        a second key that allows the device connector to make electrical connection with the device bay connector when the key slot of the device is located in a second location on the device;

wherein the first key and the second key prevent the device connector from making electrical connection with the device bay connector when the key slot of the device is not located in either of the first location or the second location;

wherein the first key is connected to a pivot connection of a rod of the device bay;

wherein the second key is connected to a pivot connection of the rod; and, wherein the rod rotates around a pivot connector.

* * * * *

UNITED STATES PATENT AND TRADEMARK OFFICE
CERTIFICATE OF CORRECTION

| | | |
|---|---|---|
| PATENT NO. | : 8,608,493 B2 | Page 1 of 1 |
| APPLICATION NO. | : 13/456147 | |
| DATED | : December 17, 2013 | |
| INVENTOR(S) | : David R Cowles et al. | |

It is certified that error appears in the above-identified patent and that said Letters Patent is hereby corrected as shown below:

In the Claims

In column 3, line 52, in Claim 1, delete "by" and insert -- bay --, therefor.

In column 4, line 2, in Claim 3, delete "position" and insert -- position on --, therefor.

Signed and Sealed this
Sixth Day of May, 2014

Michelle K. Lee
*Deputy Director of the United States Patent and Trademark Office*